(12) United States Patent
Orita

(10) Patent No.: US 7,998,876 B2
(45) Date of Patent: Aug. 16, 2011

(54) METHOD OF PRODUCING SEMICONDUCTOR ELEMENT

(75) Inventor: Toshiyuki Orita, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/721,854

(22) Filed: Mar. 11, 2010

(65) Prior Publication Data

US 2010/0248483 A1    Sep. 30, 2010

(30) Foreign Application Priority Data

Mar. 31, 2009  (JP) .................................. 2009-086574

(51) Int. Cl.
*H01L 21/461* (2006.01)

(52) U.S. Cl. ........ 438/734; 438/700; 438/701; 438/706; 438/711; 438/712; 438/713; 438/723; 438/737; 438/738; 438/739; 438/744; 438/745; 438/748; 438/749; 438/757; 257/E21.249; 257/E21.252; 257/E21.255; 257/E21.256; 257/E21.267

(58) Field of Classification Search ........................ None
See application file for complete search history.

(56) References Cited

U.S. PATENT DOCUMENTS

| 4,889,588 | A * | 12/1989 | Fior | ............................. | 438/713 |
| 2002/0001875 | A1 * | 1/2002 | Hermes et al. | ................ | 438/118 |

FOREIGN PATENT DOCUMENTS

| JP | 05-343347 | 12/1993 |
| JP | 07-094441 | 4/1995 |

* cited by examiner

*Primary Examiner* — Charles D Garber
*Assistant Examiner* — Yasser A Abdelaziez
(74) *Attorney, Agent, or Firm* — Kubotera & Associate LLC

(57) ABSTRACT

A method of producing a semiconductor element includes the steps of forming a wiring portion layer on a substrate; forming an interlayer insulation layer over the substrate and the wiring portion layer, in which a third insulation film, a second insulation film, and a first insulation film are laminated in this order from the substrate; forming a mask pattern on the first insulation film; removing a contact hole forming area of the first insulation film through a wet etching process; removing a contact hole forming area of the second insulation film through an etching process; removing a contact hole forming area of the third insulation film through an etching process; and a contact hole forming step of forming a contact hole in the interlayer insulation layer so that a surface of the wiring portion layer is exposed.

4 Claims, 12 Drawing Sheets

METHOD OF PRODUCING SEMICONDUCTOR ELEMENT

BACKGROUND OF THE INVENTION AND RELATED ART STATEMENT

The present invention relates to a method of producing a semiconductor element. More specifically, the present invention relates to a method of producing a semiconductor element, in which a contact hole is formed in an interlayer insulation layer formed of more than three layers of films such as a phosphorus-containing silicon oxide film (a PSG film), a silicon nitride film (an SiN film) and an insulation film.

Conventionally, when a semiconductor element is produced, first, an interlayer insulation layer having a three-layer structure is formed on a wiring portion layer. Then, a contact hole is formed in the interlayer insulation layer through an etching process (refer to Patent References 1 and 2).

Patent Reference 1: Japanese Patent Publication No. 07-94441

Patent Reference 2: Japanese Patent Publication No. 05-343347

In particular, when the contact hole is formed in the interlayer insulation layer having the three-layer structure formed of a phosphorus-containing silicon oxide film (a PSG film), a silicon nitride film (an SiN film) and an insulation film (for example, an NSG film), the following manufacturing steps are generally performed.

In the first step, a mask pattern for forming the contact hole is formed on the PSG film through a photolithography technology. In the second step, a contact hole forming area of the PSG film is removed through a wet etching process. In the third step, a contact hole forming area of the SiN film and the insulation film (for example, an NSG film) is removed through an anisotropic dry etching process. In the fourth step, the mask pattern is removed through an asking technology.

In the conventional method including the manufacturing steps described above, it is difficult to prevent a residue with a column shape from generating in the anisotropic dry etching process or the wet etching process.

In view of the problems described above, an object of the present invention is to provide a method of producing a semiconductor element capable of solving the problems of the conventional method of producing the semiconductor element, and preventing a residue with a column shape from generating in an etching process.

Further objects and advantages of the invention will be apparent from the following description of the invention.

SUMMARY OF THE INVENTION

In order to attain the objects described above, according to a first aspect of the present invention, a method of producing a semiconductor element includes a wiring portion layer forming step of forming a wiring portion layer on a substrate; an interlayer insulation layer forming step of forming an interlayer insulation layer over the substrate and the wiring portion layer, in which a third insulation film, a second insulation film containing SiN, and a first insulation film formed of a phosphorus containing silicon oxide film are laminated in this order from the substrate; a mask pattern forming step of forming a mask pattern on the first insulation film; a first insulation film etching step of removing a contact hole forming area of the first insulation film through a wet etching process after the mask pattern is formed; a second insulation film etching step of removing a contact hole forming area of the second insulation film through an etching process including at least an isotropic dry etching process after the first insulation film etching step; a third insulation film etching step of removing a contact hole forming area of the third insulation film through an etching process after the second insulation film etching step; and a contact hole forming step of forming a contact hole in the interlayer insulation layer so that a surface of the wiring portion layer is exposed.

In the first aspect of the present invention, the method of producing the semiconductor element provides an effect described below.

As described in BACKGROUND OF THE INVENTION AND RELATED ART STATEMENT, in the conventional method of producing the semiconductor element, it is difficult to prevent a residue with a column shape from generating in the isotropic dry etching process or the wet etching process. More specifically, when the phosphorus-containing silicon oxide film (the PSG film) is subject to the wet etching, an etching residue may remain and attach to a surface of the PSG film. When the anisotropic etching is performed on the SiN film in the state that the etching residue remains, the etching residue acts as a mask. Accordingly, a portion of the SiN film where the etching residue attaches is converted into the residue with a column shape.

In the first aspect of the present invention, the second insulation film etching step is performed on the second insulation film through the etching process including at least the isotropic dry etching process after the first insulation film etching step. Accordingly, even if an etching residue may remain and attach to a surface of the second insulation film after the wet etching process, the isotropic dry etching process is performed on the second insulation film. Accordingly, the isotropic dry etching process proceeds in the second insulation film not only in a vertical direction relative to a surface of the substrate, but also in other directions such as a lateral direction. As a result, the isotropic dry etching process proceeds in a portion of the second insulation film where the etching residue attaches, thereby preventing a residue with a column shape from generating in the etching process.

In the method of producing the semiconductor element in the first aspect of the present invention, the second insulation film etching step may preferably include one of steps of performing an anisotropic dry etching process after the isotropic dry etching process is performed and performing only the isotropic dry etching process.

When the second insulation film etching step includes one of the steps described above, the isotropic dry etching process is first performed on the second insulation film formed of SiN after the wet etching process is performed on the first insulation film formed of the phosphorus containing silicon oxide film (a PSG film). Accordingly, it is possible to effectively prevent a residue with a column shape from generating in the etching process.

According to a second aspect of the present invention, a method of producing a semiconductor element includes a wiring portion layer forming step of forming a wiring portion layer on a substrate; an interlayer insulation layer forming step of forming an interlayer insulation layer over the substrate and the wiring portion layer, in which a third insulation film, a second insulation film containing SiN, and a first insulation film formed of a phosphorus containing silicon oxide film are laminated in this order from the substrate; a mask pattern forming step of forming a mask pattern on the first insulation film; a first insulation film etching step of removing a contact hole forming area of the first insulation film through a wet etching process after the mask pattern is formed; a second insulation film etching step of removing a contact hole forming area of the second insulation film through an anisotropic dry etching process including a side etching after the first insulation film etching step; a third insulation film etching step of removing a contact hole forming area of the third insulation film through an etching process after the second insulation film etching step; and a contact hole forming step of forming a contact hole in the interlayer insulation layer so that a surface of the wiring portion layer is exposed.

In the second aspect of the present invention, the method of producing the semiconductor element provides an effect described below.

As described above, in the conventional method of producing the semiconductor element, it is difficult to prevent a residue with a column shape from generating in the isotropic dry etching process or the wet etching process.

In the second aspect of the present invention, the second insulation film etching step is performed on the second insulation film through the anisotropic dry etching process including the side etching after the first insulation film etching step. Accordingly, even if an etching residue may remain and attach to a surface of the second insulation film after the wet etching process, the anisotropic dry etching process including the side etching is performed on the second insulation film. Accordingly, the anisotropic dry etching process proceeds in the second insulation film in a vertical direction relative to a surface of the substrate, while the side etching proceeds (the side etching proceeds in a lateral direction relative to the surface of the substrate). As a result, the etching process proceeds in a portion of the second insulation film where the etching residue attaches, thereby preventing a residue with a column shape from generating in the etching process.

In the method of producing the semiconductor element in the second aspect of the present invention, the second insulation film etching step may be preferably performed using a mixture of chlorofluorocarbon gas and oxygen ($O_2$) gas through adjusting a mixture ratio of oxygen ($O_2$) gas so that the side etching proceeds.

When the second insulation film etching step is performed using the mixture of chlorofluorocarbon gas and oxygen ($O_2$) gas through adjusting the mixture ratio of oxygen ($O_2$) gas so that the side etching proceeds, it is possible to securely perform the side etching. Accordingly, it is possible to effectively prevent a residue with a column shape from generating in the etching process.

As described above, according to the first aspect and the second aspect of the present invention, it is possible to provide the method of producing the semiconductor element capable of preventing a residue with a column shape from generating in the etching process.

DETAILED DESCRIPTION OF PREFERRED EMBODIMENTS

Hereunder, preferred embodiments of the present invention will be explained with reference to the accompanying drawings.

First Embodiment

A first embodiment of the present invention will be explained. In the first embodiment of the present invention, a method of producing a semiconductor element 10 includes a wiring portion layer forming step; an interlayer insulation layer forming step; a contact hole forming step; a mask pattern forming step; a first insulation film etching step; a second insulation film etching step; and a third insulation film etching step.

Figure 1:
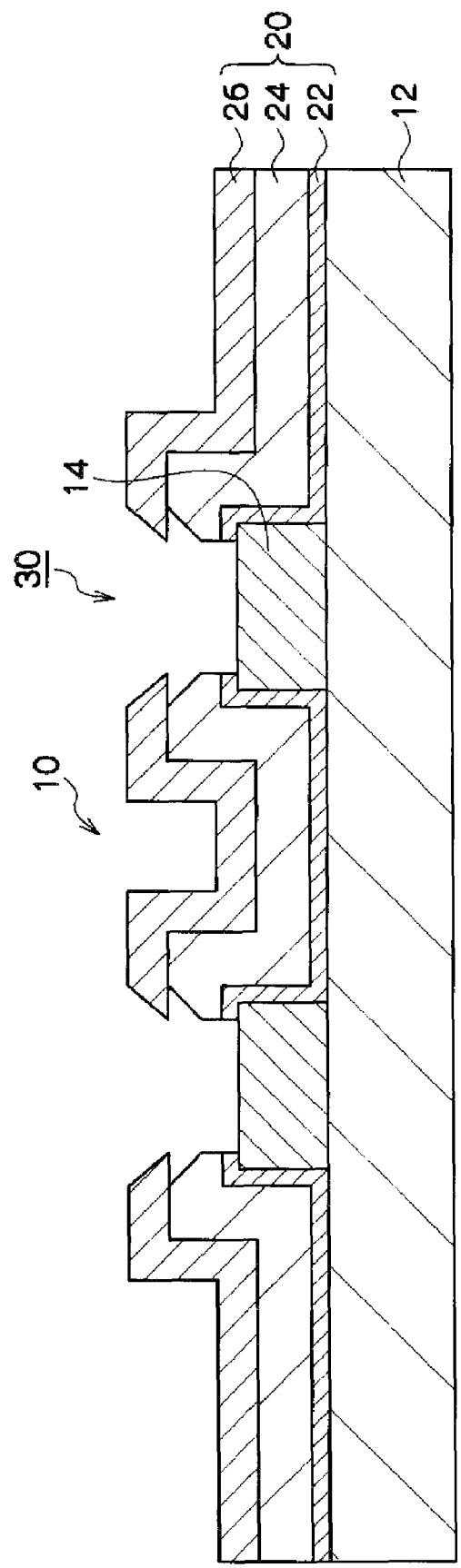
FIG. 1 is a schematic sectional view showing a configuration of a semiconductor element produced with a method of producing the semiconductor element according to a first embodiment of the present invention.

The first embodiment of the present invention will be explained with reference to FIGS. 1 to 8. FIG. 1 is a schematic sectional view showing a configuration of the semiconductor element 10 produced with the method of producing the semiconductor element 10 according to the first embodiment of the present invention. FIGS. 2 to 8 are schematic sectional views No. 1 to No. 7 showing the method of producing the semiconductor element 10 according to the first embodiment of the present invention.

As shown in FIG. 1, the semiconductor element 10 includes a wiring portion layer 14 on a surface of a substrate 12. Further, the semiconductor element 10 includes an interlayer insulation layer 20 formed to cover the wiring portion layer 14 and the substrate 12. A type of semiconductor element is not limited to the semiconductor element 10, and may include any type of semiconductor elements such as a bipolar transistor, an MOS transistor, MIS transistor, a BiCMOS transistor, and the like.

In the wiring portion layer forming step in the first embodiment of the present invention, the wiring portion layer 14 is not limited to a specific layer, and may be a gate electrode layer, other electrode layer, a multiple wiring portion layer, and the like formed on the substrate 12.

Figure 2:
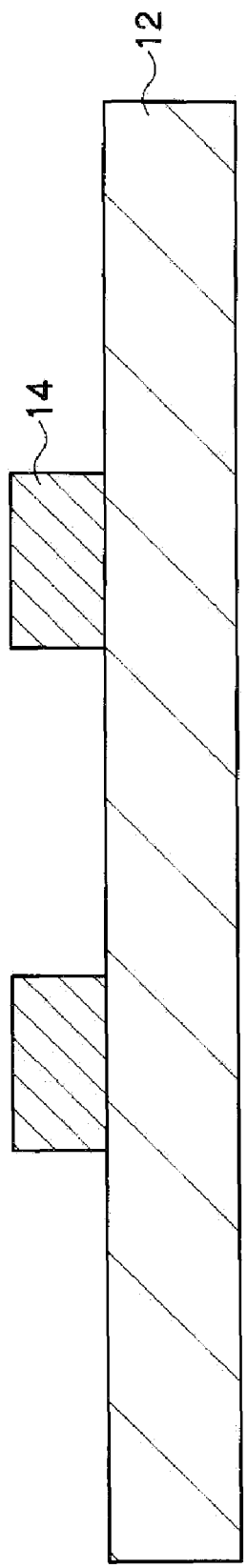
FIG. 2 is a schematic sectional view No. 1 showing the method of producing the semiconductor element according to the first embodiment of the present invention.

When a metal wiring portion pattern is formed as the wiring portion layer 14, for example, an NSG film is first formed on the surface of the substrate 12 with a CVD method. Then, an Al—Cu (a metal) film is formed on an entire surface of the NSG film with a sputtering method. In the next step, a pattern of an Al—Cu wiring portion (a metal wiring portion) is formed through a lithography technique and a dry etching technique. Lastly, a resist is removed through an asking technique, thereby forming the wiring portion layer 14 on the substrate 12 as shown in FIG. 2.

In the interlayer insulation layer forming step in the first embodiment of the present invention, the interlayer insulation layer 20 is formed of a third insulation film 22, a second insulation film 24 (an SiN film) containing SiN, and a first insulation film 26 (a PSG film) formed of a phosphorus containing silicon oxide film. The first insulation film 26, the second insulation film 24, and the third insulation film 22 are laminated on the substrate 12 in this order from a lower layer side.

Figure 3:
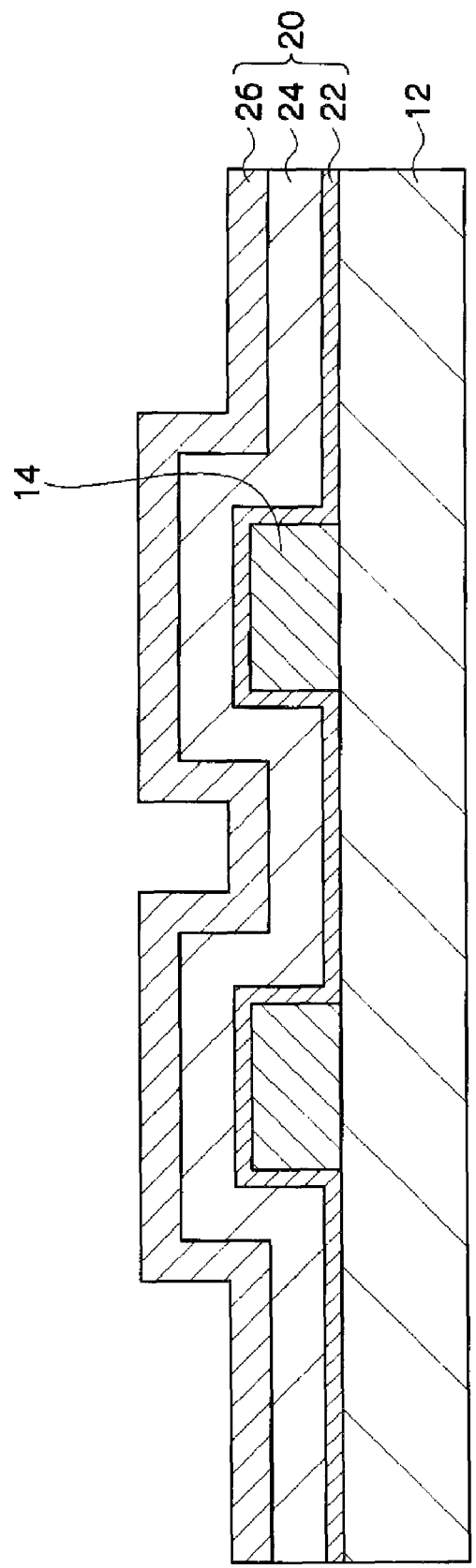
FIG. 3 is a schematic sectional view No. 2 showing the method of producing the semiconductor element according to the first embodiment of the present invention.
Figure 4:
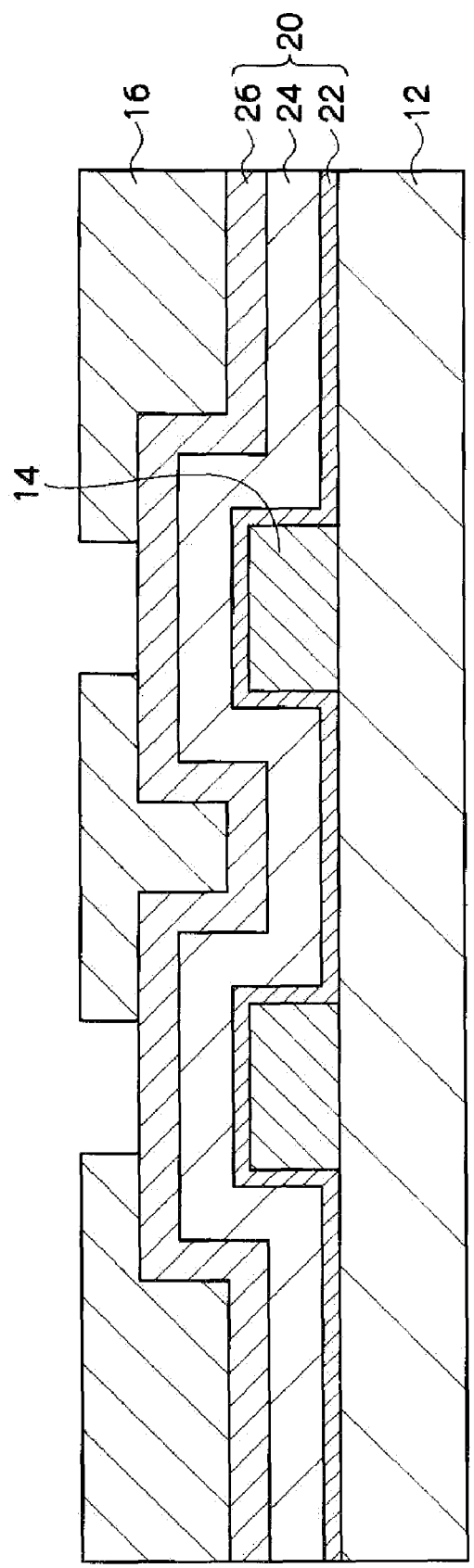
FIG. 4 is a schematic sectional view No. 3 showing the method of producing the semiconductor element according to the first embodiment of the present invention.

In the semiconductor element 10 shown in FIG. 3, for example, the third insulation film 22 has a film thickness of 200 nm, the second insulation film 24 (the SiN film) has a film thickness of 1,000 nm, and the first insulation film 26 (the PSG film) has a film thickness of 600 nm.

In the interlayer insulation layer forming step, as shown in FIG. 3, the third insulation film 22, the second insulation film 24 (the SiN film), and the first insulation film 26 (the PSG film) are sequentially formed on the substrate 12 with the wiring portion layer 14 formed thereon.

In the embodiment, the third insulation film 22 may include an NSG (Non-doped Silicate Glass) film, a PSG (Phosphorous Silicate Glass) film, and the like. The third insulation film 22 may be formed with, for example, a CVD method. Especially when the third insulation film 22 is formed of the NSG film or the PSG film, the third insulation film 22 has a function of alleviating a stress between the wiring portion layer 14 and the second insulation film 24 (the SiN film).

More specifically, the NSG film or the PSG film generally has a stress in a tensional direction (a tensile direction), while the SiN film has a stress in a compression direction (a compressive direction). Accordingly, the stress in the NSG film or the PSG film is canceled out with the stress in the SiN film, thereby alleviating the stress between the wiring portion layer 14 and the second insulation film 24 (the SiN film).

In the embodiment, the second insulation film 24 (the SiN film) may be formed with, for example, a normal pressure CVD method, a reduced pressure CVD method, a plasma CVD method, and the like using a gas such as silane gas, ammonium gas, and the like. Note that the second insulation film 24 has a function of a protective film for blocking oxygen, moisture, a metal ion, and the like.

In the embodiment, the first insulation film 26 (the PSG film) may be formed with, for example, a CVD method using silane gas and $PH_3$ gas. A concentration of phosphorous (P) in the first insulation film 26 (the PSG film) is not limited to a specific level. Note that the first insulation film 26 (the PSG film) has a function of preventing a property from deteriorating due to filler attack when the semiconductor element 10 is mounted using a plastic package.

In the contact hole forming step in the first embodiment, after the interlayer insulation layer 20 is formed through the steps described above, a contact hole 30 is formed in the interlayer insulation layer 20 at a specific position thereof. The contact hole 30 is formed through manufacturing steps described below. Accordingly, it is possible to securely prevent a residue with a column shape when the second insulation film 24 (the SiN film) is formed.

In the mask pattern forming step in the first embodiment, first, a resist film is formed on the first insulation film 26 (the PSG film). Then, the resist film is patterned through a lithography technique to form a mask pattern 16 shown in FIG. 4, so that an opening portion is formed in the resist film for forming the contact hole 30.

Figure 9:
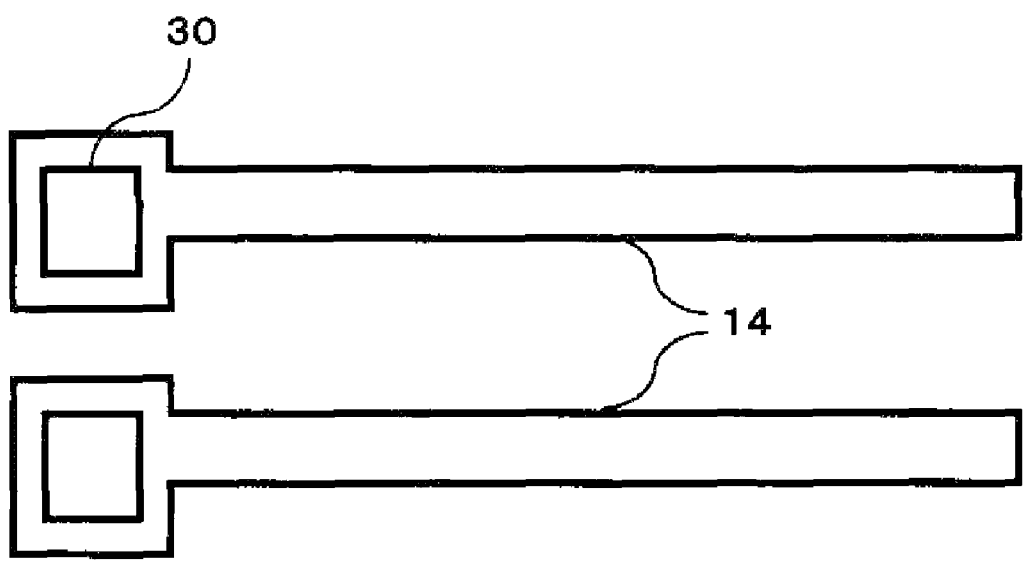
FIG. 9 is a schematic plan view showing the semiconductor element according to the first embodiment of the present invention.

FIG. 9 is a schematic plan view showing the semiconductor element 10 according to the first embodiment of the present invention. As shown in FIG. 9, the contact hole 30 is formed at a position (a layout position) in a surrounding area of the wiring portion layer 14.

Figure 5:
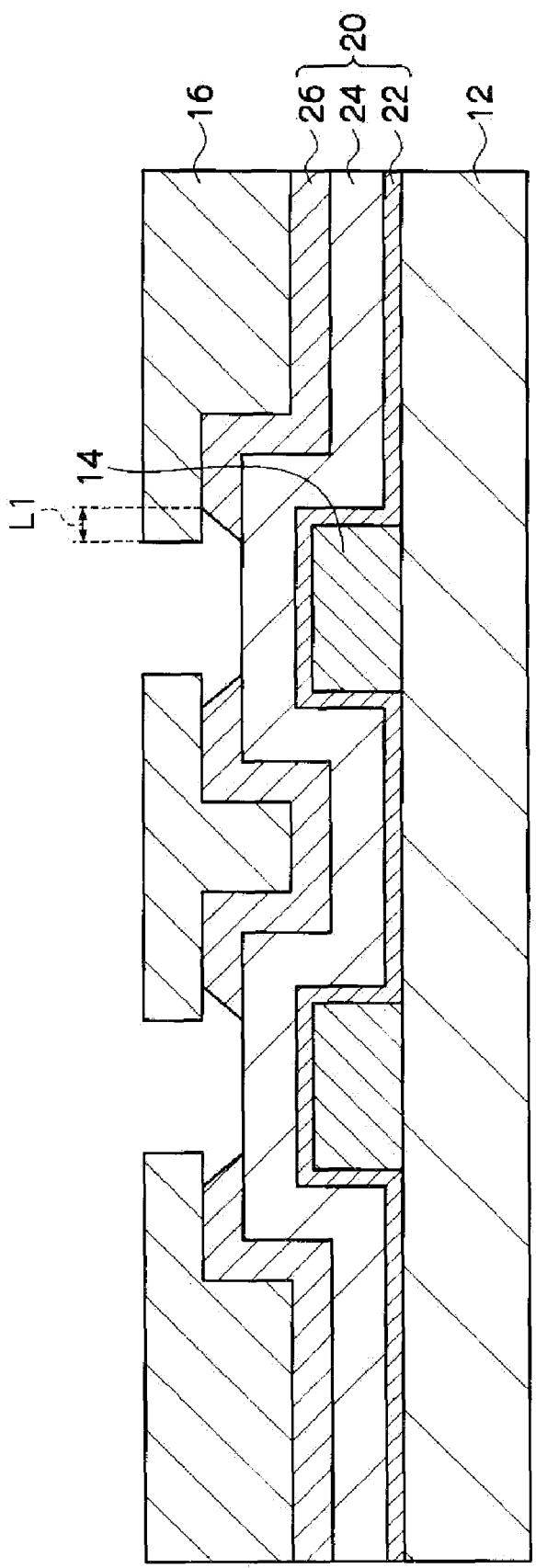
FIG. 5 is a schematic sectional view No. 4 showing the method of producing the semiconductor element according to the first embodiment of the present invention.

In the first insulation film etching step in the first embodiment, as shown in FIG. 5, a portion of the first insulation film 26 (the PSG film) where the contact hole 30 is formed in the later step is removed through a wet etching process. A method of the wet etching process may include a well-known method such as an immersion method, a spray method, and the like. A solution such as a solution mixture of $NH_4F$ and $CH_3COOH$ and the like is used as an etching solution. The wet etching process is performed at an arbitrary temperature, and preferably at a solution temperature of 25° C.

When the wet etching process, i.e., an isotropic etching process, is performed on the first insulation film 26 (the PSG film), the wet etching process proceeds in a vertical direction and a horizontal direction with respect to the surface of the substrate 12. Accordingly, a hole with a tapered shape slope is formed in the portion of the first insulation film 26 (the PSG film) where the contact hole 30 is formed.

In the embodiment, as described above, the first insulation film 26 (the PSG film) shown in FIG. 5 has the thickness of 600 nm. Accordingly, the hole with the tapered shape slope has a depth (a distance L1 from an inner wall of the opening portion of the mask pattern 16 to an outer edge of the hole) of 600 nm. Further, the tapered shape slope has an angle of 45° relative to the surface of the substrate 12.

Figure 6:
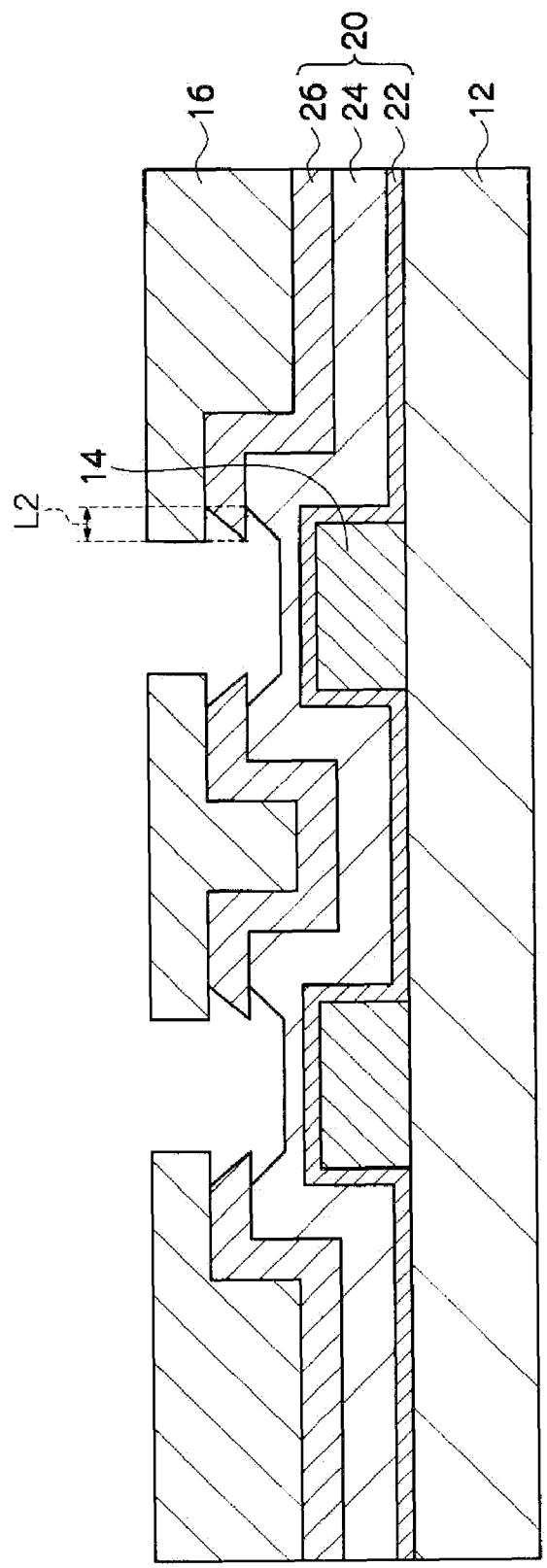
FIG. 6 is a schematic sectional view No. 5 showing the method of producing the semiconductor element according to the first embodiment of the present invention.
Figure 7:
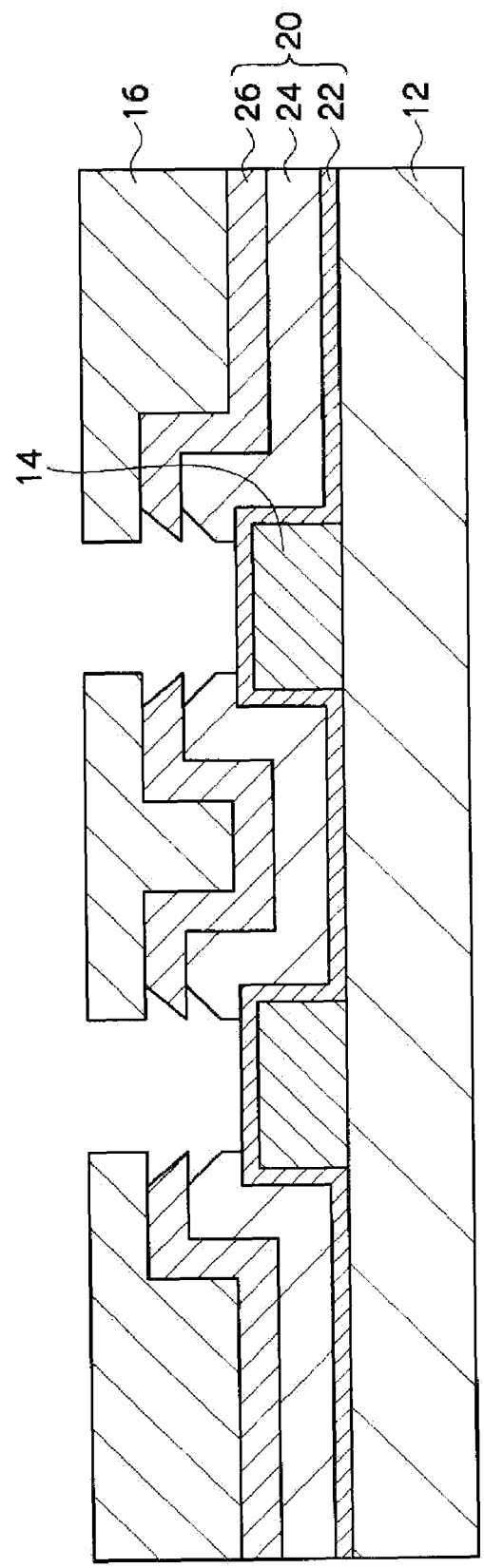
FIG. 7 is a schematic sectional view No. 6 showing the method of producing the semiconductor element according to the first embodiment of the present invention.

In the second insulation film etching step in the first embodiment, a portion of the second insulation film 24 (the SiN film) where the contact hole 30 is formed in the later step is removed through an etching process including at least an isotropic dry etching process. In particular, it is preferred that the isotropic dry etching process is performed first as shown in FIG. 6. Then, an anisotropic dry etching process is performed as shown in FIG. 7.

In the embodiment, when the isotropic dry etching process is performed, a device such as an anode couple RIE device and the like is used. An etching gas used in the isotropic dry etching process includes a mixture of a chlorofluorocarbon gas and oxygen ($O_2$) gas. The chlorofluorocarbon gas includes a gas containing a compound formed of carbon, hydrogen, chlorine, fluorine, and the like. In particular, the chlorofluorocarbon gas includes $CF_4$, $CHF_3$, $NF_3$, $SF_6$, $C_4F_8$, and the like. As a preferred example, the isotropic dry etching process is performed using a mixture of $CF_4$ and $O_2$ (=200/50 SCCM) under a condition of 1 Torr and an RF power of 300 W.

When the isotropic dry etching process is performed as shown in FIG. 6 using the gas mixture under the conditions described above, the second insulation film 24 (the SiN film) is etched in the vertical direction with respect to the surface of the substrate 12 up to a depth of 300 nm. Accordingly, a hole with a tapered shape slope is formed in the second insulation film 24 (the SiN film) at an upper portion of the portion of the second insulation film 24 (the SiN film) where the contact hole 30 is formed. Note that the hole with the tapered shape slope shown in FIG. 6 has a depth (a distance L2 from the inner wall of the opening portion of the mask pattern 16 to an outer edge of the hole) of 300 nm. Further, the tapered shape slope has an angle of 45° relative to the surface of the substrate 12.

In the embodiment, after the isotropic dry etching process is performed, when the anisotropic dry etching process is performed, a device such as the anode couple RIE device and the like is used. An etching gas used in the anisotropic dry etching process includes a mixture of a chlorofluorocarbon gas and oxygen ($O_2$) gas. As a preferred example, the anisotropic dry etching process is performed using a mixture of $CF_4$, $CHF_3$, Ar, and $O_2$ (=500/20/500/10 SCCM) under a condition of 1 Torr and an RF power of 300 W.

In the anisotropic dry etching process shown in FIG. 7, a remaining portion of the portion of the second insulation film 24 (the SiN film) where the contact hole 30 is formed is removed in the vertical direction with respect to the surface of the substrate 12, thereby forming a vertical hole.

In the second insulation film etching step in the first embodiment, only the isotropic dry etching process may be performed to remove the portion of the second insulation film 24 (the SiN film) where the contact hole 30 is formed.

Figure 8:
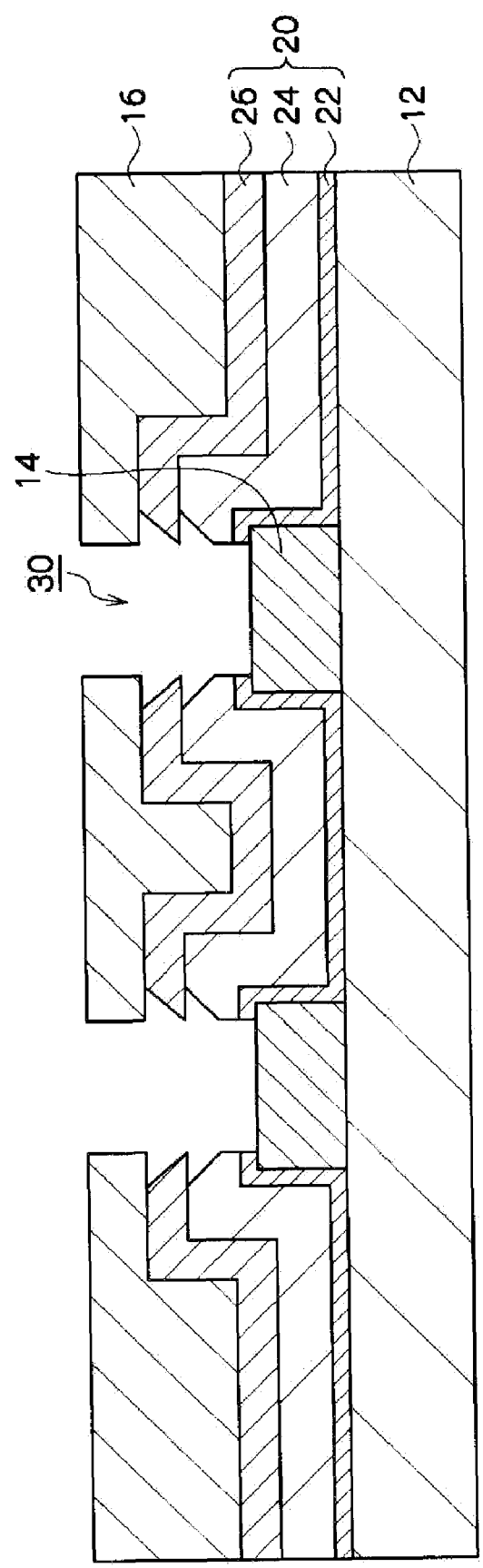
FIG. 8 is a schematic sectional view No. 7 showing the method of producing the semiconductor element according to the first embodiment of the present invention.

In the third insulation film etching step in the first embodiment shown in FIG. 8, an etching process is performed, so that a portion of the third insulation film 22 where the contact hole 30 is formed is removed. The etching process is not limited to a specific method, and may include any method. In particular, the anisotropic dry etching process in the second insulation film etching step may be continuously performed in the third insulation film etching step.

When the anisotropic dry etching process in the second insulation film etching step is continuously performed on the third insulation film 22, the portion of the third insulation film 22 where the contact hole 30 is formed is removed as shown in FIG. 8, thereby forming a vertical hole. Afterward, the mask pattern is removed through an asking technique, thereby producing the semiconductor element 10 shown in FIG. 1.

Second Embodiment

A second embodiment of the present invention will be explained. In the second embodiment of the present invention, a method of producing the semiconductor element 100 includes a wiring portion layer forming step; an interlayer insulation layer forming step; a contact hole forming step; a mask pattern forming step; a first insulation film etching step; a second insulation film etching step; and a third insulation film etching step.

In the second embodiment, the wiring portion layer forming step, the interlayer insulation layer forming step, the contact hole forming step, the mask pattern forming step, and the first insulation film etching step are similar to those in the first embodiment. Accordingly, explanations thereof are omitted.

Figure 10:
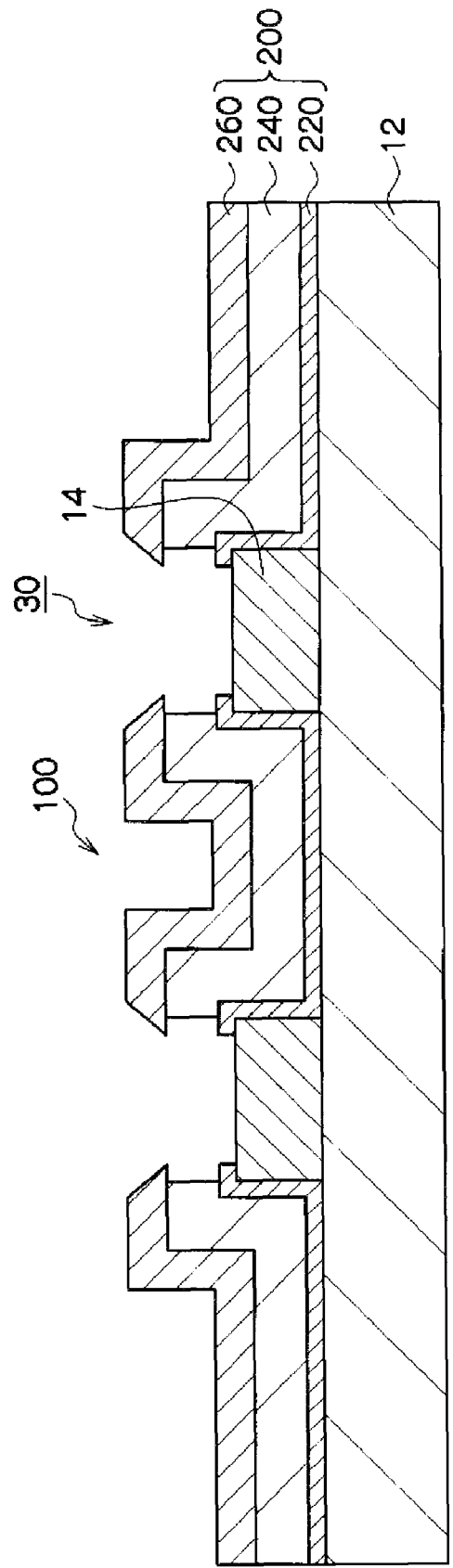
FIG. 10 is a schematic sectional view showing a configuration of a semiconductor element produced with a method of producing the semiconductor element according to a second embodiment of the present invention.
Figure 11:
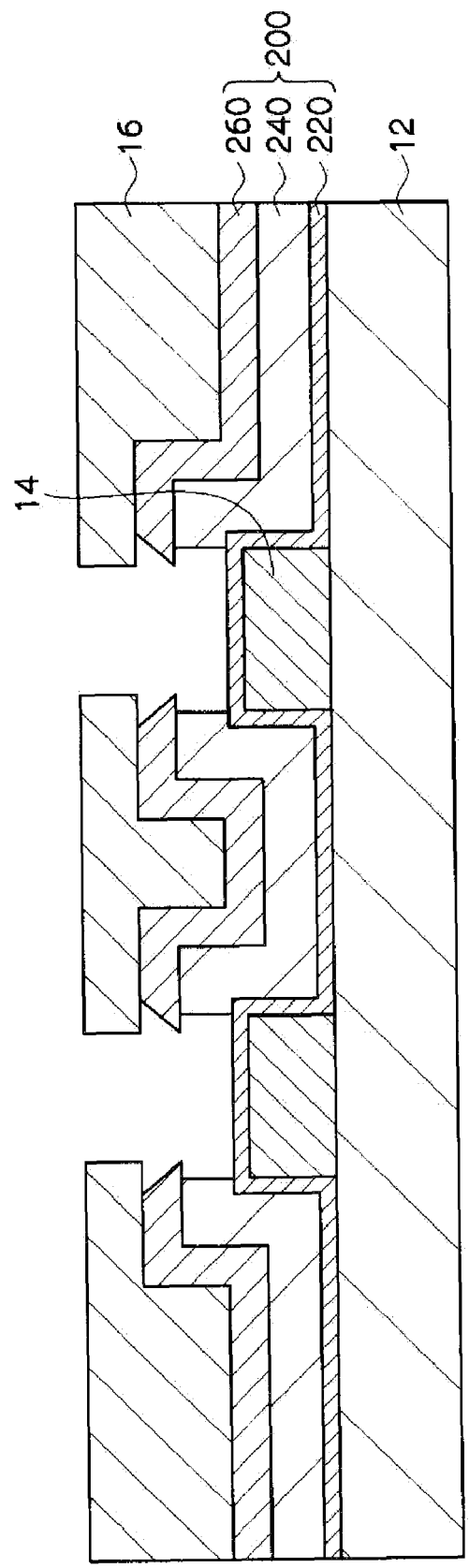
FIG. 11 is a schematic sectional view No. 1 showing the method of producing the semiconductor element according to the second embodiment of the present invention.
Figure 12:
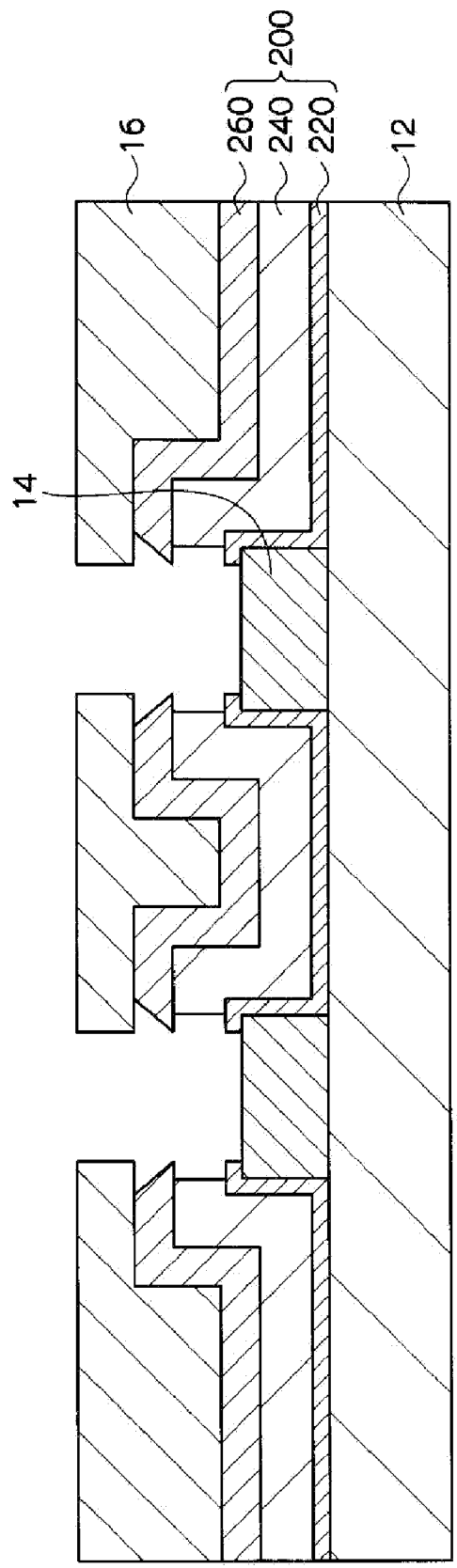
FIG. 12 is a schematic sectional view No. 2 showing the method of producing the semiconductor element according to the second embodiment of the present invention.

The second embodiment will be explained with reference to FIGS. 10 to 12. FIG. 10 is a schematic sectional view showing a configuration of the semiconductor element 100 produced with the method of producing the semiconductor element 100 according to the second embodiment of the present invention. FIGS. 11 to 12 are schematic sectional views No. 1 to No. 2 showing the method of producing the semiconductor element 100 according to the second embodiment of the present invention.

As shown in FIG. 10, the semiconductor element 100 includes the wiring portion layer 14 on the surface of the substrate 12. Further, the semiconductor element 100 includes an interlayer insulation layer 200 formed to cover the wiring portion layer 14 and the substrate 12. A type of semiconductor element is not limited to the semiconductor element 100, and may include any type of semiconductor elements such as a bipolar transistor, an MOS transistor, MIS transistor, a BiCMOS transistor, and the like.

As described above, in the second embodiment, the wiring portion layer forming step, the interlayer insulation layer forming step, the contact hole forming step, the mask pattern forming step, and the first insulation film etching step are similar to those in the first embodiment. Accordingly, explanations thereof are omitted. Note that the interlayer insulation layer 200 is formed of a third insulation film 220, a second insulation film 240 (an SiN film), and a first insulation film 260 (a PSG film).

In the second insulation film etching step in the second embodiment, after a portion of the first insulation film 260 (the PSG film) where the contact hole 30 is formed is removed in the first insulation film etching step, a portion of the second insulation film 240 (the SiN film) where the contact hole 30 is formed in the later step is removed through an anisotropic etching process including a side etching.

In the embodiment, when the anisotropic dry etching process including the side etching is performed, a device such as an anode couple RIE device and the like is used. An etching gas used in the anisotropic dry etching process includes a mixture of a chlorofluorocarbon gas and oxygen ($O_2$) gas. An example of the gas mixture includes a mixture of $CHF_3$, $CF_4$ and $O_2$ (a mixture ratio: 10/500/50), a mixture of $CF_4$ and $O_2$ (a mixture ratio: 200/50), and a mixture of $SF_6$ and $O_2$ (a mixture ratio: 100/10). In particular, the anisotropic dry etching process is preferably performed using the mixture of $CF_4$ and $O_2$ (=200/50 SCCM) under a condition of 1 Torr and an RF power of 300 W.

In the anisotropic dry etching process including the side etching shown in FIG. 11, the portion of the second insulation film 240 (the SiN film) where the contact hole 30 is formed is removed in the vertical direction with respect to the surface of the substrate 12, thereby forming a vertical hole.

In the third insulation film etching step in the second embodiment shown in FIG. 12, an etching process is performed, so that a portion of the third insulation film 220 where the contact hole 30 is formed is removed. The etching process is not limited to a specific method, and may include any method. In particular, the anisotropic dry etching process in the second insulation film etching step may be continuously performed in the third insulation film etching step.

In the anisotropy dry etching process in the second insulation film etching step, the side etching proceeds in the second insulation film 240 (the SiN film). When the third insulation film 220 is formed of the NSG film or the PSG film, it is possible to perform the etching process in the vertical direction with respect to the surface of the substrate 12 while the side etching does not proceed to a large extent due to a difference in an etching speed.

When the anisotropic dry etching process in the second insulation film etching step is continuously performed on the third insulation film 220, the portion of the third insulation film 220 where the contact hole 30 is formed is removed as shown in FIG. 12, thereby forming a vertical hole. Afterward, similar to the first embodiment, the mask pattern is removed through an asking technique, thereby producing the semiconductor element 10 shown in FIG. 10.

The disclosure of Japanese Patent Application No. 2009-086574, filed on Mar. 31, 2009, is incorporated in the application by reference.

While the invention has been explained with reference to the specific embodiments of the invention, the explanation is illustrative and the invention is limited only by the appended claims.

What is claimed is:

1. A method of producing a semiconductor element, comprising:
   a wiring portion layer forming step of forming a wiring portion layer on a substrate;
   an interlayer insulation layer forming step of forming an interlayer insulation layer over the substrate and the wiring portion layer, said interlayer insulation layer including a third insulation film, a second insulation film containing SiN, and a first insulation film formed of a phosphorus containing silicon oxide film laminated in this order from the substrate;
   a mask pattern forming step of forming a mask pattern on the first insulation film;
   a first insulation film etching step of removing a first contact hole forming area of the first insulation film through a wet etching process after the mask pattern is formed;
   a second insulation film etching step of removing a second contact hole forming area of the second insulation film through an etching process including at least an isotropic dry etching process after the first insulation film etching step;
   a third insulation film etching step of removing a third contact hole forming area of the third insulation film through an etching process after the second insulation film etching step; and
   a contact hole forming step of forming a contact hole in the interlayer insulation layer so that a surface of the wiring portion layer is exposed.

2. The method of producing the semiconductor element according to claim 1, wherein said second insulation film etching step includes one of steps of performing an anisotropic dry etching process after the isotropic dry etching process is performed and performing only the isotropic dry etching process.

3. A method of producing a semiconductor element, comprising:
   a wiring portion layer forming step of forming a wiring portion layer on a substrate;
   an interlayer insulation layer forming step of forming an interlayer insulation layer over the substrate and the wiring portion layer, said interlayer insulation layer including a third insulation film, a second insulation film containing SiN, and a first insulation film formed of a phosphorus containing silicon oxide film laminated in this order from the substrate;
   a mask pattern forming step of forming a mask pattern on the first insulation film;
   a first insulation film etching step of removing a first contact hole forming area of the first insulation film through a wet etching process after the mask pattern is formed;
   a second insulation film etching step of removing a second contact hole forming area of the second insulation film through an anisotropic dry etching process including a side etching after the first insulation film etching step;
   a third insulation film etching step of removing a third contact hole forming area of the third insulation film through an etching process after the second insulation film etching step; and
   a contact hole forming step of forming a contact hole in the interlayer insulation layer so that a surface of the wiring portion layer is exposed.

4. The method of producing the semiconductor element according to claim 3, wherein said second insulation film etching step is performed using a mixture of chlorofluorocarbon gas and oxygen ($O_2$) gas through adjusting a mixture ratio of oxygen ($O_2$) gas so that the side etching proceeds.

* * * * *